(12) United States Patent
Lu et al.

(10) Patent No.: US 7,576,551 B2
(45) Date of Patent: Aug. 18, 2009

(54) TEST SOCKET AND TEST BOARD FOR WAFER LEVEL SEMICONDUCTOR TESTING

(75) Inventors: Sheng-Feng Lu, Hsinchu (TW);
Shih-Ming Chen, Kaohsiung (TW);
Chien-Pang Lin, Taoyuan (TW);
Ming-Hsun Sung, Taoyuan (TW)

(73) Assignee: VisEra Technologies Company Limited, Hsinchu (TW)

( * ) Notice: Subject to any disclaimer, the term of this patent is extended or adjusted under 35 U.S.C. 154(b) by 68 days.

(21) Appl. No.: 11/902,309

(22) Filed: Sep. 20, 2007

(65) Prior Publication Data
US 2009/0079461 A1    Mar. 26, 2009

(51) Int. Cl.
*G01R 31/26* (2006.01)
(52) U.S. Cl. .................... 324/755; 324/765
(58) Field of Classification Search .............. None
See application file for complete search history.

(56) References Cited

U.S. PATENT DOCUMENTS

| | | | | |
|---|---|---|---|---|
| 5,576,630 A | * | 11/1996 | Fujita | 324/760 |
| 6,204,681 B1 | * | 3/2001 | Nagatsuka et al. | 324/761 |
| 6,483,331 B2 | * | 11/2002 | Tamaru et al. | 324/754 |
| 6,559,665 B1 | * | 5/2003 | Barabi | 324/755 |
| 6,566,899 B2 | * | 5/2003 | Tamaru et al. | 324/754 |
| 6,891,386 B2 | * | 5/2005 | Matsuzawa | 324/760 |

\* cited by examiner

*Primary Examiner*—Vinh P Nguyen
(74) *Attorney, Agent, or Firm*—Muncy, Geissler, Olds & Lowe, PLLC

(57) ABSTRACT

A test board for wafer level semiconductor testing is disclosed. The test board comprises a plurality of wires and microelectronic devices; and a plurality of test sockets on an upper surface of the test board. Each test socket comprises: a base member configured for attachment to the test board with a first set of screws, wherein the base member has a central opening exposing a portion of the underlying test board; an anisotropic conductive film disposed within the central opening of the base member; a chip to be tested, disposed on the anisotropic conductive film within the central opening of the base member; and a cover member overlying the chip, attached to the base member with a second set of screws.

14 Claims, 8 Drawing Sheets

TEST SOCKET AND TEST BOARD FOR WAFER LEVEL SEMICONDUCTOR TESTING

BACKGROUND OF THE INVENTION

1. Field of the Invention

The present invention relates to wafer level semiconductor testing, and in particular relates to a test board for wafer level semiconductor testing.

2. Description of the Related Art

Packaging is an essential step in the fabrication of integrated circuits, which protects the integrated circuits and provides a signal transmission interface for external circuits. Therefore, the development of packaging is related to the development of integrated circuit technology and the function of electronic products. A variety of packaging technologies have been developed, such as ball grid array (BGA), chip scale package (CSP), flip chip, and multi-chip module (MCM).

A BGA (ball grid array) type semiconductor device using a TAB tape as an interposer is shown as a representative example of these semiconductor devices in FIGS. 1 and 2. This device is a BGA type semiconductor device of the so-called "PSR via type" wherein, while leaving via holes 12 for solder balls (PSR via), an insulating film 2 composed of a photosolder resist (PSR) is provided on a tape substrate 5, composed of an insulating film, on its side where a wiring pattern 3 is provided.

Specifically, FIGS. 1 and 2 show the construction of a conventional semiconductor device. A TAB tape 1 used in the semiconductor device comprises: a tape substrate 5 formed of a polyimide resin insulating film; a wiring pattern 3 which has been formed by bonding a copper foil onto one side of the tape substrate 5 through an adhesive 4 and photoetching the copper foil and has, on its one end, a bonding pad 10 for connection to a semiconductor and has, on its other end or in a portion between both ends thereof, a solder ball mounting pad 30; and an insulating film 2 in a predetermined PSR pattern, which has been formed on the surface of the wiring pattern 3 in the region of the solder ball mounting pad 30 while leaving a via hole 12 for a solder ball, by printing a photosolder resist resin by means of a printing plate on the wiring pattern 3 and subjecting the print to pattern exposure and development. With the TAB tape 1 as a wiring tape for mounting a semiconductor element for wire bonding purposes, a window hole is generally formed in the center portion by stamping, and the insulating film 2 is not formed in the portion of the bonding pad 10 on the tape substrate 5 and a region extended inward from the bonding pad 10. In manufacturing the semiconductor device, shown in FIG. 1, by using this TAB tape 1, a remote side from the wiring pattern 3 (opposite side of the tape substrate 5) of a semiconductor chip 7, is applied through an adhesive 6 onto the tape substrate 5, and an electrode 8 in the semiconductor chip 7 is electrically connected to the bonding pad 10 in the TAB tape through a bonding wire 9 formed of gold. Next, the connection in the wire bonding, that is, the bonding lead portion, is sealed by a mold resin 11. Thereafter, solder balls 13 formed by reflow treatment are mounted respectively on the solder ball mounting pads 30 in such a manner that the solder balls 13 are arrayed in via holes 12 for solder balls.

According to the semiconductor device described, a wiring pattern 3 is provided on the tape substrate on the side opposite to the side on which the semiconductor chip 7 on the element formation surface is put. This construction permits the element electrode 8 in the semiconductor chip 7 to be bonded to the wiring pattern 3 through the bonding wire 9 which is passed through the window hole 15. Therefore, the bonding wire 9 can be provided without being extended around the periphery of the semiconductor chip 7. This can eliminate the need to ensure, on the periphery of the semiconductor chip 7, a wiring space for the bonding wire 9 and thus can reduce the size and thickness of the whole device. Further, since wire bonding can be carried out, a difference in coefficient of thermal expansion between the semiconductor element and the substrate can be absorbed by the bonding wire 9. This is advantageous, for example, in that an inexpensive resin substrate rather than an expensive ceramic substrate can be used. However, it has been found that, in sealing the bonding lead portion by the mold resin, the mold resin spreads on the PSR pattern and flows into the via hole (PSR via) for a solder ball and, consequently, the solder ball disadvantageously detaches from the via hole. While BGA technology offers advantages of higher connection densities on the circuit board and higher manufacturing yields which lowers product cost, it is not without disadvantages. For instance, solder joints cannot be easily inspected, and circuit board level cannot be easily reworked, i.e. correcting problems after attachment of the BGA package to the circuit board, is more difficult since, having no replaceable components, the BGA connectors are typically unserviceable.

Flip chip is also a commonly used packaging method, which employs a solder bump formed on a bonding pad for connection to the circuit board. The formation of the solder bump comprises solder ball mounting, printing, and electroplating. FIGS. 3A to 3D illustrate a conventional method for forming a solder bump structure by electroplating.

As shown in FIG. 3A, a substrate 100, such as a silicon substrate, is provided. The substrate 100 has a metal bonding pad 102 comprising, for example, aluminum or copper. A passivation layer 104, such as a silicon nitride layer, is formed overlying the substrate 100 and substantially exposes the metal bonding pad 102. A metal composite layer 106 is conformably formed on the passivation layer 104 and the exposed metal bonding pad 102, which is typically a metal stack of adhesion layer/barrier layer/wetting layer. In order to simplify the diagram, a single layer is depicted. As shown in FIG. 3B, a dry pattern film 108 is formed on the metal composite layer 106, which has an opening 109 to expose a portion of the metal composite layer 106 overlying the metal bonding pad 102. Here, the opening region 109 is utilized in forming solder bump. Accordingly, the opening 109 is subsequently filled with a solder 110 by electroplating. The height of the solder is determined by the thickness of the dry pattern film 108. As shown in FIG. 3C, the dry pattern film 108 is removed and the metal composite layer 106 is uncovered by the solder 110 and then removed, exposing the underlying passivation layer 104. The remaining metal composite layer 106a acts as an under bump metallurgy (UBM) layer. As shown in FIG. 3D, a reflow process is performed, such that the solder 110 forms a ball-shaped or hemiball-shaped solder bump 110a due to surface tension.

The height of the solder bump, however, affects reliability of packaging devices. As the size of the package is reduced, fatigue strength is degraded if the height of the solder bump is too low, reducing the bonding life. Moreover, during bonding of the chip to the circuit board, the gap between the chip and the circuit board cannot be effectively filled with the underfill, thus forming holes therein. Accordingly, the reliability of the flip chip method can be increased by providing higher solder bump. Generally, the methods for increasing the height of the solder bump are to increase the dry film thickness or size of the UBM layer, thereby increasing the capacity of the solder to accomplish the higher solder bump. Unfortunately, such methods may be detrimental for lithography or increase the occupied area of the chip, reducing the integration. Similarly to BGA technology, for flip chip technology, solder joints cannot be easily inspected, and circuit board level cannot be easily reworked, i.e. correcting problems after attachment of the solder bump package to the circuit board, is more difficult since, having no replaceable components, the solder bump connectors are typically unserviceable.

Alternatively, in order to achieve compactness, semiconductor devices having a semiconductor package in the size of a chip referred to as CSP have also been developed. The size of CSP is substantially the same as that of the chip or slightly larger than the chip. There is the resin sealed type semiconductor device which is referred to as a Wafer Level Chip Scale Package/Wafer Level Chip Scale Package (hereinafter W-CSP) among CSP. The size of W-CSP is the same as that of the chip. The conventional CSP type semiconductor device will be described with reference to FIG. 4. FIG. 4(a) is a plane view showing the conventional semiconductor device having a wafer level chip size package structure individually divided from a wafer. FIG. 4(b) is a cross sectional view taken along line DD' of the conventional semiconductor device shown in FIG. 4(a).

The conventional semiconductor device comprises a semiconductor chip 1000, an oxide film 1001, a plurality of electrical pads 1002, an insulating film 1003, a plurality of redistributions 1004, a plurality of posts 1005, a plurality of solder bumps 1006 and a sealing resin 1007. The semiconductor chip 1000 has a main surface having a central area 1000a and a peripheral area 1000b surrounding the central area 1000a. A circuit, e.g. a transistor etc, is formed on the main surface in the peripheral area 1000b. There is nothing on the main surface in the central area 1000a. The oxide film 1001 is formed on the main surface of the semiconductor chip 1000 in all areas. The electrical pads 1002 are formed on the oxide film 1001 in the peripheral area 1000b. The electrical pads 1002 are electrically connected to the circuit formed on the semiconductor chip 1000. The insulating film 1003 is formed on the oxide film 1001 in all areas and on the electrical pads 1002. The redistributions 1004 are formed on the electrical pads 1002 and the insulating film 1003 in the peripheral area 1000b. The redistributions 1004 are electrically connected to the electrical pad 1002. The posts 1005 are formed on the redistributions 1004 being formed on the insulating film 1003 and are electrically connected to the redistributions 1004. The solder balls 1006 are formed on an end of the posts 1005 and are electrically connected to the posts 1005. The sealing resin 1007 seals the insulating film 1003, the redistributions 1004 and side surfaces of the posts 1005.

For conventional CSP type semiconductor devices, similar packaging inefficiencies mentioned previously, are also seen. That is, solder joints cannot be easily inspected, and circuit board level cannot be easily reworked, i.e. correcting problems after attachment of the package to the circuit board, is more difficult since, having no replaceable components, the connectors are typically unserviceable.

BRIEF SUMMARY OF THE INVENTION

In view of aforementioned problems, a test board incorporating small sockets and anisotropic conductive films is provided.

In one embodiment, a test board for wafer level semiconductor testing is disclosed. The test board comprises a plurality of wires and microelectronic devices; and a plurality of test sockets on an upper surface of the test board. Each test socket comprises: a base member configured for attachment to the test board with a first set of screws, wherein the base member has a central opening exposing a portion of the underlying test board; an anisotropic conductive film disposed within the central opening of the base member; a chip to be tested, disposed on the anisotropic conductive film within the central opening of the base member; and a cover member overlying the chip, attached to the base member with a second set of screws.

In another embodiment, a test socket incorporated into a test board for wafer level semiconductor testing is disclosed. The test socket comprises: a base member configured for attachment to the test board with a first set of screws, wherein the base member has a central opening exposing a portion of the underlying test board; an anisotropic conductive film disposed within the central opening of the base member; a chip to be tested, disposed on the anisotropic conductive film within the central opening of the base member; and a cover member overlying the chip, attached to the base member with a second set of screws.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
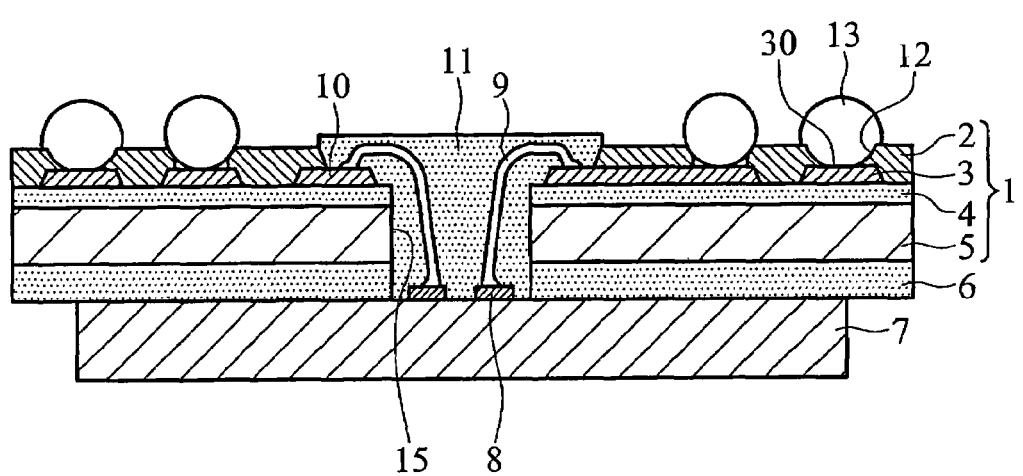
FIG. 1 is a cross-sectional view of a conventional semiconductor device using a TAB tape.
Figure 2:
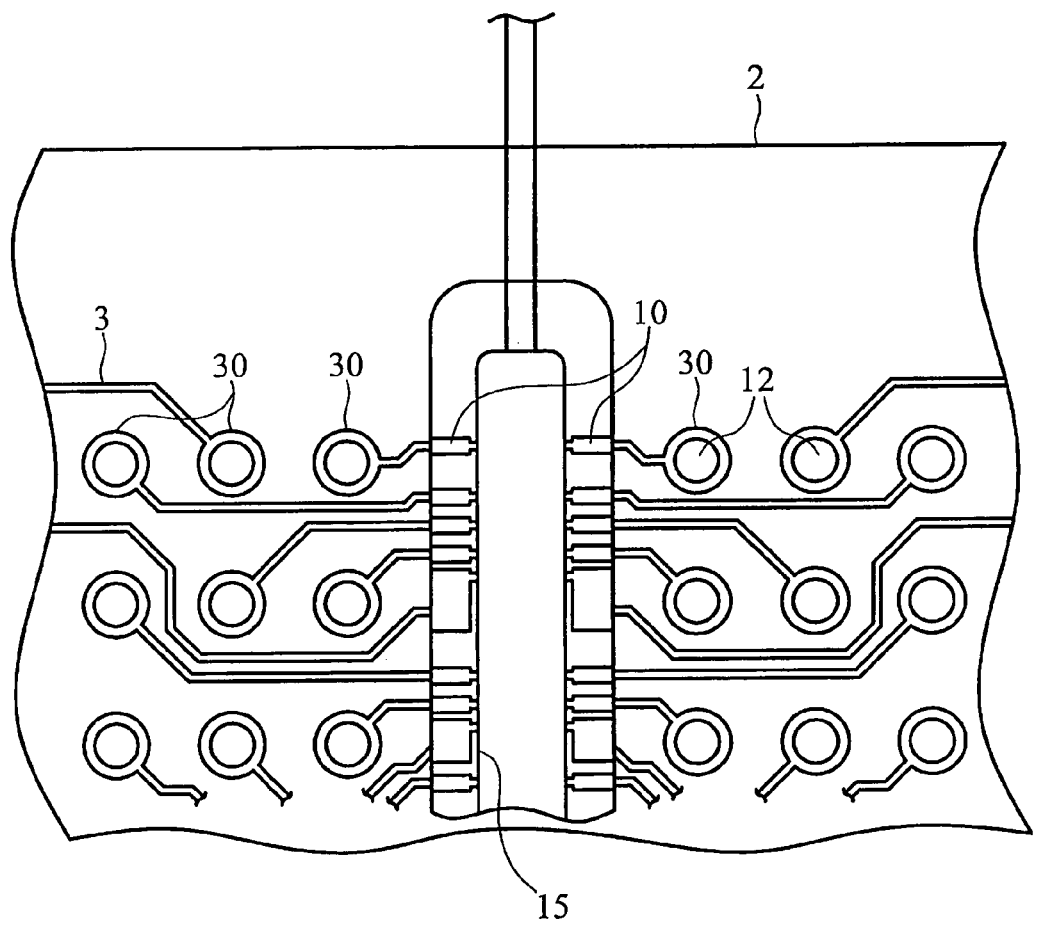
FIG. 2 is a plan view of the TAB tape, as viewed from PSR side, used in the conventional semiconductor device shown in FIG. 1.
Figure 3A:
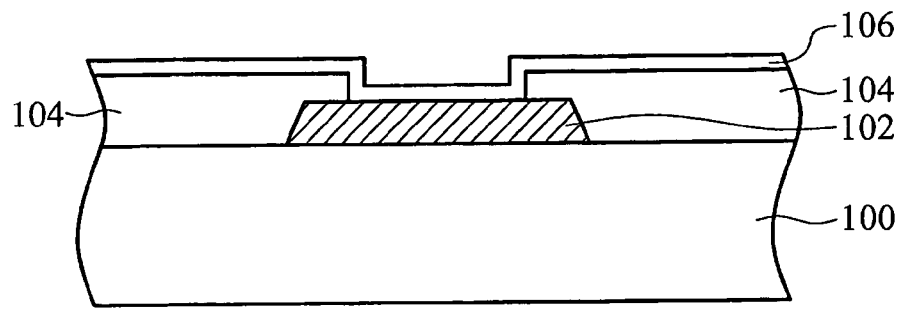
FIGS. 3A to 3D are cross-sections of a conventional method for forming a solder bump structure by electroplating.
Figure 3B:
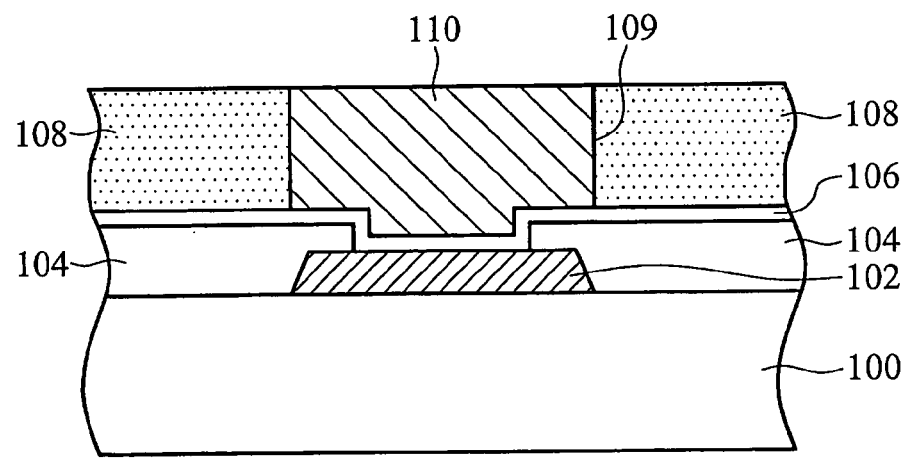
Figure 3C:
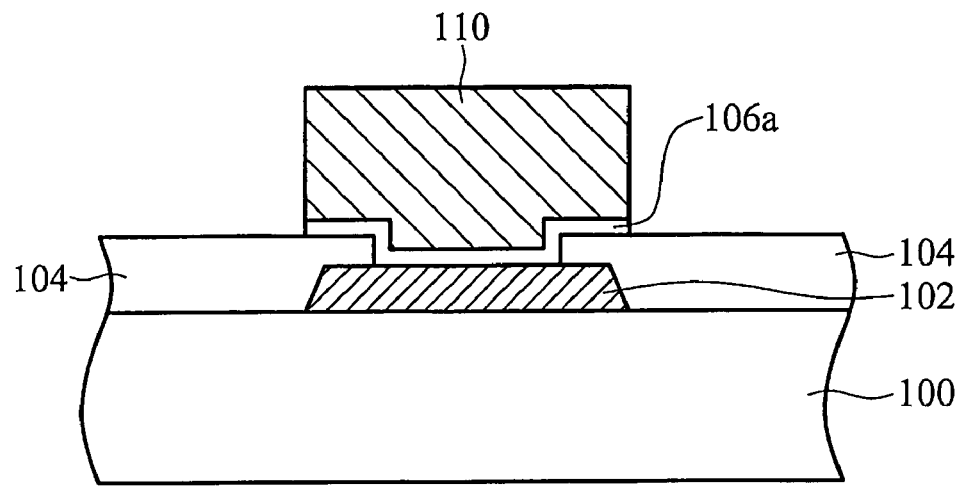
Figure 3D:
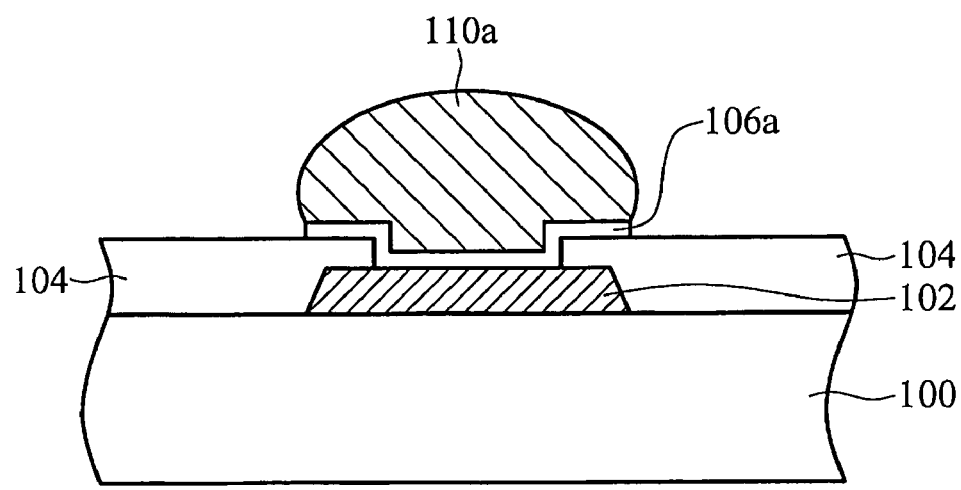
Figure 4A:
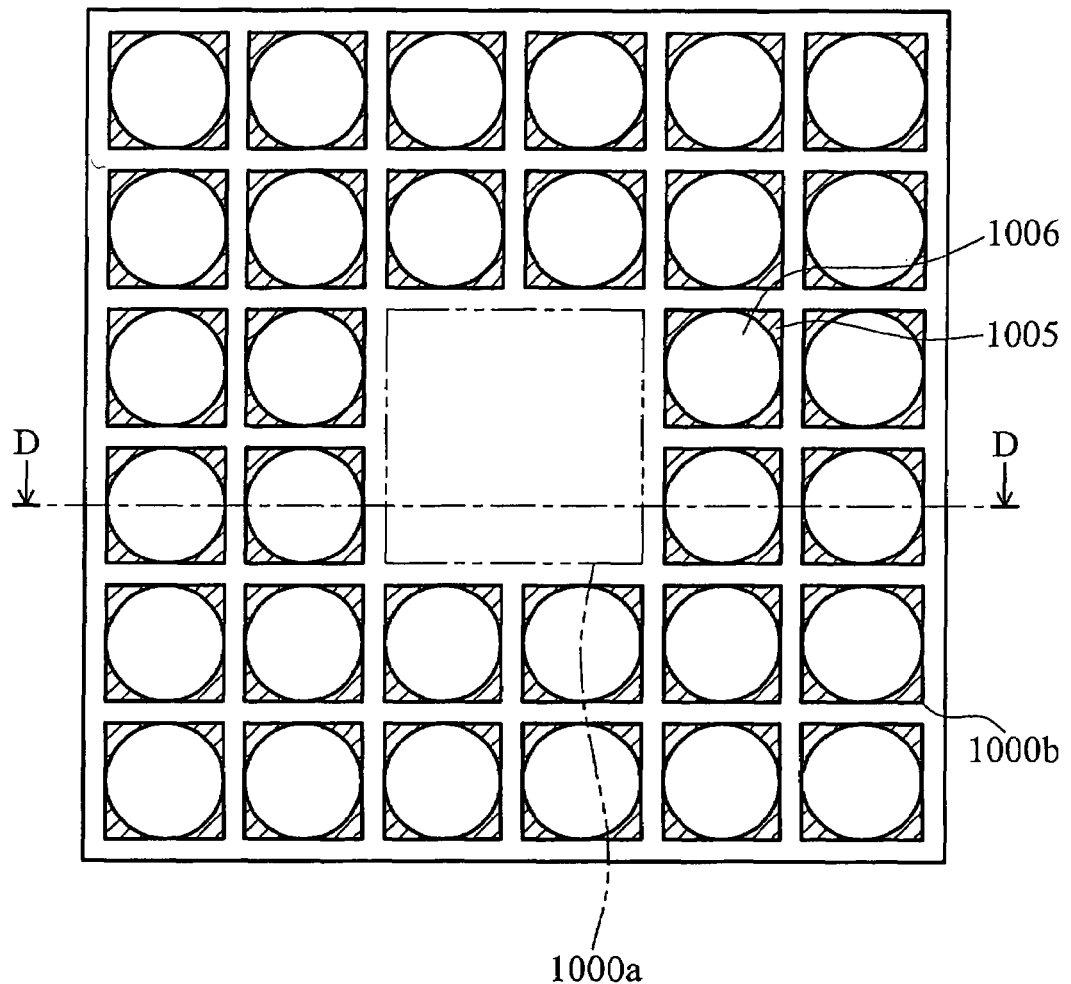
FIG. 4 is a cross sectional view of the conventional semiconductor device.
Figure 4B:
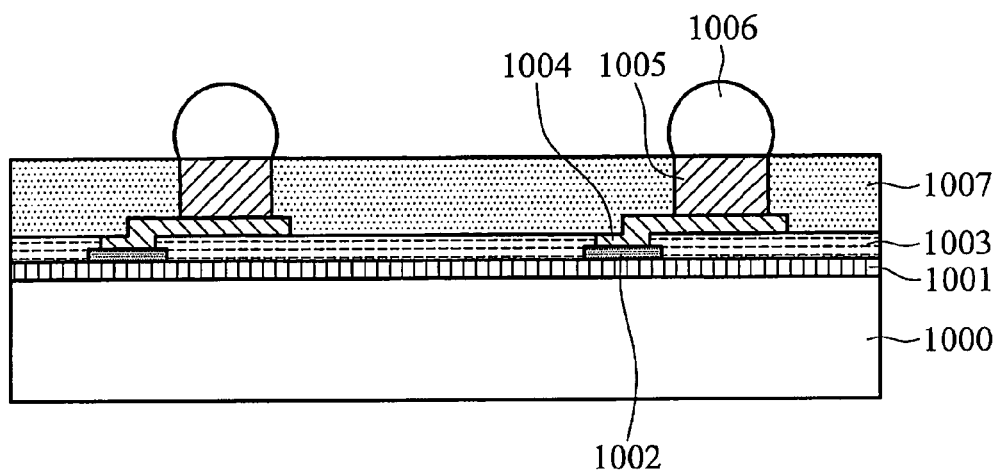

The following description is of the best-contemplated mode of carrying out the invention. This description is made for the purpose of illustrating the general principles of the invention and should not be taken in a limiting sense. The scope of the invention is best determined by reference to the appended claims.

References will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 5:
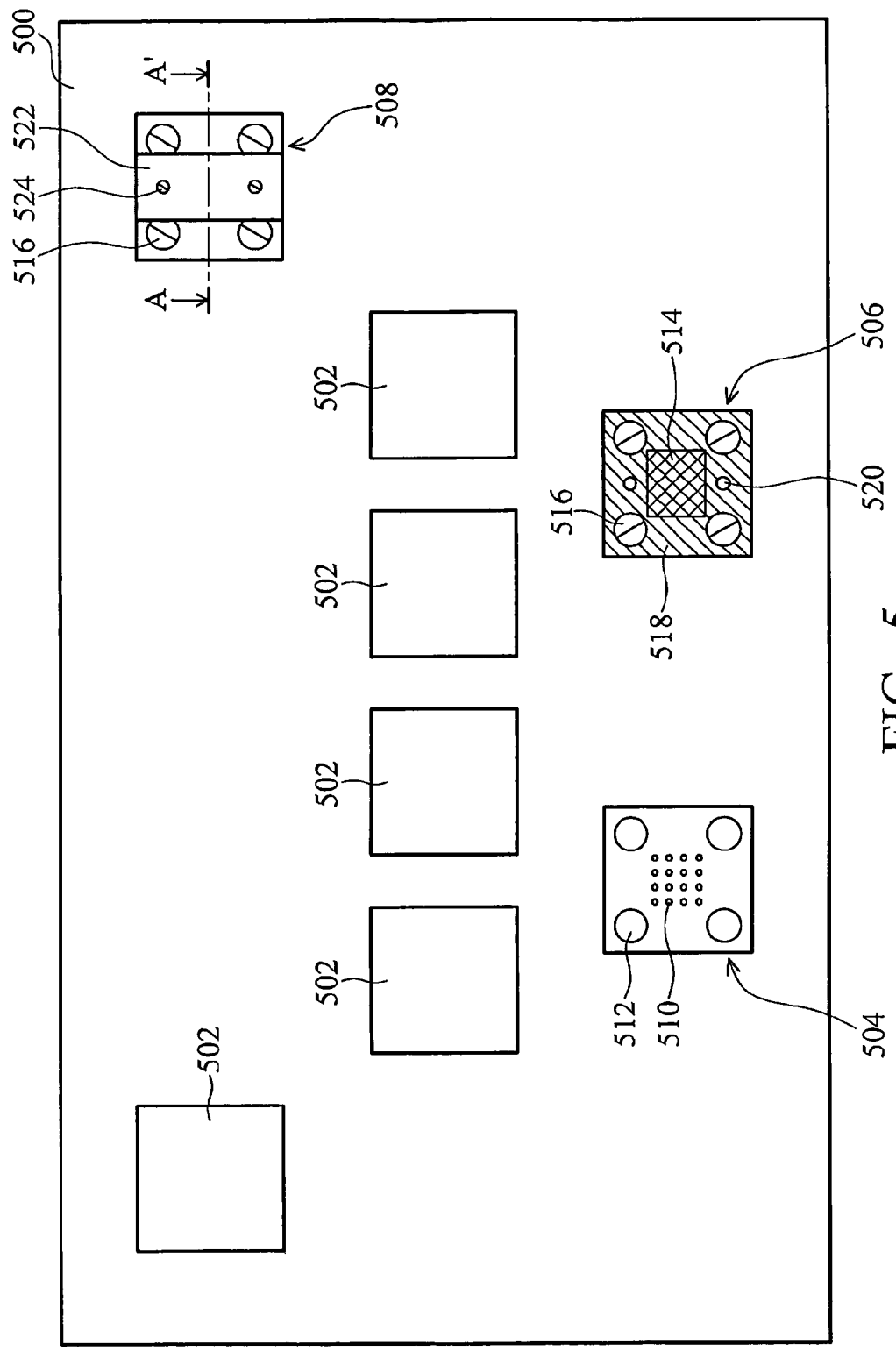
FIG. 5 is a plan view of one embodiment of a test board for wafer level semiconductor testing
Figure 6:
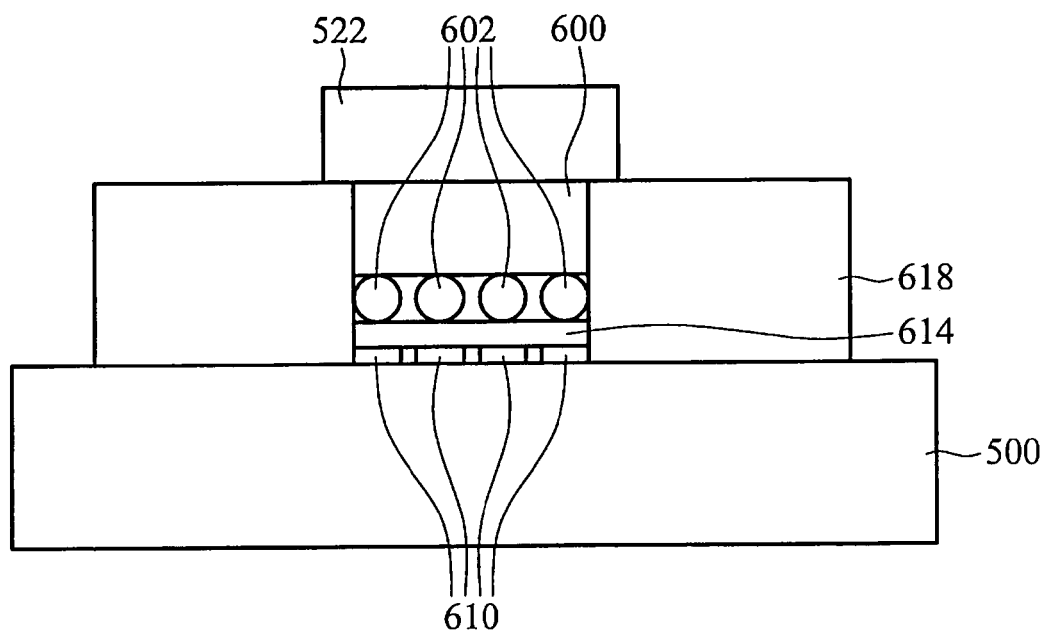
FIG. 6 is a cross sectional view of a test socket shown in FIG. 5 along a section line AA'.

For convenience of maintenance and rework, an embodiment of test sockets and a test board for wafer level semiconductor testing is proposed, as shown in FIGS. 5 and 6. FIG. 5 is a plan view of one embodiment of a test board for wafer level semiconductor testing. FIG. 6 is a cross sectional view of a test socket shown in FIG. 5 along a section line AA'.

Referring to FIGS. 5 and 6, a test board 500 (such as a multilayer printed circuit board) is provided for wafer level semiconductor testing. The test board 500 includes a plurality of wires (not shown) and microelectronic devices 502 thereon. Specifically, the test board 500 features formation of a plurality of test sockets (such as 508) incorporating an anisotropic conductive film 614 on an upper surface thereof. Each test socket includes a base member (such as 518 or 618) configured for attachment to the test board 500 with screws 516. The base member (such as 518 or 618) has a central opening exposing a portion (such as 510) of the underlying test board. Each test socket also includes an anisotropic conductive film (such as 514 or 614) disposed within the central opening of the base member (such as 518 or 618). In addition, a chip 600 to be tested is disposed on the anisotropic conductive film (such as 514 or 614) within the central opening of the base member (such as 518 or 618). Furthermore, a cover member 522 overlying the chip 600 is attached to the base member (such as 518 or 618) with screws 524.

Referring back to FIG. 5, numerals 504 and 506 refer to regions for formation of sockets, and four openings 512 for screws 516 to pass through are formed therein. Numeral 510 refers to conductive pads formed on or in the test board 500. In the region 506, the base member 518 is attached to the test board 500 by passing of screws 516 through the openings (such as 512). Specifically, the base member 518 has a central opening where an anisotropic conductive film 514 is disposed within, exposing a portion (i.e. conductive pads 510) of the underlying test board 500. The base member 518 also has two openings for other screws (such as 524) to pass through. That is, the cover member 522 overlying the anisotropic conductive film 514 is attached to the base member 518 by passing of screws 524 through the openings (such as 520).

Referring to FIG. 6, it is a cross sectional view of a test socket shown in FIG. 5 along a section line AA', showing electrical connection between the chip and the test board. As shown in FIG. 6, the chip 600 to be tested has a lower surface on which solder balls 602 are formed. In addition, conductive pads 610 are formed on the upper surface of test board 500 within the portion where the base member 618 is exposed. Accordingly, the chip 600 to be tested is electrically connected to the test board 500 via the solder balls 602, the anisotropic conductive film 614 and the conductive pads 610. When the test board 500 is coupled to automated testing machines, wafer level semiconductor testing proceeds.

According to the test sockets and the test board of the embodiments of the invention, the chip to be tested contacts the test board very well, and solder balls on the chip align with the conductive pads 610 more precisely. In addition, the test sockets allow convenience of replacement and maintenance when testing results show failure. That is, the chip after testing can be reworked and replaced easily.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test board for wafer level semiconductor testing, comprising:
    a plurality of wires and microelectronic devices on the test board; and
    a plurality of test sockets on an upper surface of the test board, wherein each test socket comprises:
        a base member configured for attachment to the test board with a first set of screws, wherein the base member has a central opening exposing a portion of the underlying test board;
        an anisotropic conductive film disposed within the central opening of the base member;
        a chip to be tested, disposed on the anisotropic conductive film within the central opening of the base member; and
        a cover member overlying the chip, attached to the base member with a second set of screws different from the first set of screws.

2. The test board for wafer level semiconductor testing of claim 1, wherein the base member has at least four openings for the first set of screws to pass through.

3. The test board for wafer level semiconductor testing of claim 1, wherein the cover member has at least two openings for the second set of screws to pass through.

4. The test board for wafer level semiconductor testing of claim 1, wherein the chip to be tested has a lower surface on which a plurality of solder balls are formed, and wherein the chip to be tested is electrically connected to the test board via the solder balls and the anisotropic conductive film.

5. The test board for wafer level semiconductor testing of claim 4, further comprises:
    a plurality of conductive pads formed on the upper surface of test board within the portion, wherein the chip to be tested is electrically connected to the test board via the solder balls, the anisotropic conductive film and the conductive pads.

6. The test board for wafer level semiconductor testing of claim 1, wherein the test board is a multilayer printed circuit board.

7. The test board for wafer level semiconductor testing of claim 1, wherein the test board is coupled to automated testing machines.

8. A test socket incorporated into a test board for wafer level semiconductor testing, comprising:
    a base member configured for attachment to the test board with a first set of screws, wherein the base member has a central opening exposing a portion of the underlying test board;
    an anisotropic conductive film disposed within the central opening of the base member;
    a chip to be tested, disposed on the anisotropic conductive film within the central opening of the base member; and
    a cover member overlying the chip, attached to the base member with a second set of screws different from the first set of screws.

9. The test socket incorporated into a test board for wafer level semiconductor testing of claim 8, wherein the base member has at least four openings for the first set of screws to pass through.

10. The test socket incorporated into a test board for wafer level semiconductor testing of claim 8, wherein the cover member has at least two openings for the second set of screws to pass through.

11. The test socket incorporated into a test board for wafer level semiconductor testing of claim 8, wherein the chip to be tested has a lower surface on which a plurality of solder balls are formed, and wherein the chip to be tested is electrically connected to the test board via the solder balls and the anisotropic conductive film.

12. The test socket incorporated into a test board for wafer level semiconductor testing of claim 11, further comprises:

a plurality of conductive pads formed on the upper surface of test board within the portion, wherein the chip to be tested is electrically connected to the test board via the solder balls, the anisotropic conductive film and the conductive pads.

13. The test socket incorporated into a test board for wafer level semiconductor testing of claim 8, wherein the test board is a multilayer printed circuit board.

14. The test socket incorporated into a test board for wafer level semiconductor testing of claim 8, wherein the test board is coupled to automated testing machines.

* * * * *